(12) United States Patent
Horikoshi et al.

(10) Patent No.: US 9,910,349 B2
(45) Date of Patent: Mar. 6, 2018

(54) AGGLUTINANT FOR PELLICLE AND A PELLICLE USING IT

(71) Applicant: SHIN-ETSU CHEMICAL CO., LTD., Tokyo (JP)

(72) Inventors: Jun Horikoshi, Annaka (JP); Yu Yanase, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 74 days.

(21) Appl. No.: 15/018,137

(22) Filed: Feb. 8, 2016

(65) Prior Publication Data
US 2016/0230056 A1    Aug. 11, 2016

(30) Foreign Application Priority Data

Feb. 10, 2015 (JP) .................................. 2015-23776

(51) Int. Cl.
*G03F 1/62* (2012.01)
*G03F 1/64* (2012.01)
*C09J 183/08* (2006.01)
*C09J 133/08* (2006.01)

(52) U.S. Cl.
CPC .............. *G03F 1/64* (2013.01); *C09J 133/08* (2013.01); *C09J 183/08* (2013.01); *G03F 1/62* (2013.01)

(58) Field of Classification Search
CPC ... G03F 1/62; G03F 1/64; C09J 133/08; C09J 183/08

USPC ............................................................ 430/5
See application file for complete search history.

(56) References Cited

U.S. PATENT DOCUMENTS

| | | | |
|---|---|---|---|
| 5,300,348 A | 4/1994 | Kubota et al. | |
| 5,370,951 A | 12/1994 | Kubota et al. | |
| 9,310,673 B2 * | 4/2016 | Yano | ........................ G03F 1/64 |
| 2014/0170535 A1 | 6/2014 | Yano et al. | |

FOREIGN PATENT DOCUMENTS

| | | |
|---|---|---|
| EP | 0554150 A1 | 8/1993 |
| JP | H11-249285 A | 9/1999 |

OTHER PUBLICATIONS

European Search Report dated Jun. 15, 2016, issued in corresponding EP Application No. 15200105.3, 6 pages.
English translation Abstract of JPH11-249285A published Sep. 17, 1999 (1 page).

* cited by examiner

*Primary Examiner* — Christopher G Young
(74) *Attorney, Agent, or Firm* — Millen White Zelano and Branigan, PC

(57) ABSTRACT

A pellicle is proposed in which the agglutinant layer which enables the pellicle to adhere to a photomask is doped with a de-foaming agent which depends on a reactive fluorine-modified silicone oil for its anti-foaming performance, and typically such reactive fluorine-modified silicone oil has a vinyl group at both ends of its molecular chain.

8 Claims, 1 Drawing Sheet

US 9,910,349 B2

AGGLUTINANT FOR PELLICLE AND A PELLICLE USING IT

Figure 1:
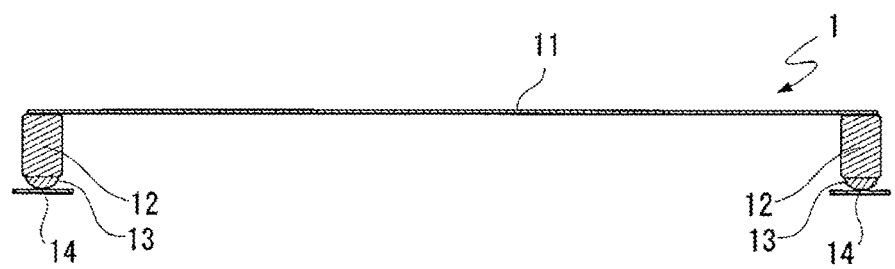

The present non-provisional patent application claims priority, as per Paris Convention, from Japanese Patent Application No. 2015-23776 filed on Feb. 10, 2015, the disclosure of which is incorporated by reference herein in its entirety.

FIELD OF THE INVENTION

The present invention relates to a pellicle for lithography, useful as a dust-fender employed in the scenes of manufacturing semiconductor devices, printed circuit boards, liquid crystal display panels, etc.; and in particular the invention relates to an agglutinant for pellicle to which an antifoaming agent based on fluorine-modified silicone oil is added.

BACKGROUND TECHNOLOGY

In manufacturing semiconductor devices such as LSI and super-LSI or in manufacturing a liquid crystal display panel or the like, a circuit pattern is made by irradiating a light to a semiconductor wafer or a negative plate for liquid crystal, but problems occur if a dust particle is sticking to a photographic mask or a reticle (hereinafter these are simply referred to as "photomask") used in this stage; for then the pattern's edges become blurred and what is more the under base gets smeared in black, whereby the dimension, quality, appearance, and other aspects of the resulting product are degraded.

Thus, these works are usually performed in a clean room, but, even in a clean room, it is yet difficult to keep the photomask clean all the time. Hence, the exposure light irradiation is conducted only after a pattern-bearing part of the surface of the photomask is sheltered by a pellicle as a dust fender. Under such circumstances, foreign particles do not directly adhere to the surface of the photomask, but only onto the pellicle membrane, and thus by setting a photo focus at a pattern on the photomask at the time of lithographing, the foreign particles on the pellicle membrane do not affect the transferred image.

In general, a pellicle is made in a manner such that a transparent pellicle membrane made of cellulose nitrate, cellulose acetate, a fluorine-containing polymer or the like, which transmit light well, is adhered to an upper annular face of a pellicle frame, which is made of an aluminum, a stainless steel, polyethylene or the like, after applying to the upper annular face a solvent which dissolves the pellicle membrane well, and then by drying the solvent by blown air (ref. IP Publication 1), or after applying to the upper annular face an adhesive made of a material such as an acrylic resin or an epoxy resin (ref. IP Publications 2, 3). Further, on a lower annular face of the pellicle frame is laid an agglutinant layer made of a polybutene resin, a polyvinyl acetate resin, an acrylic resin, a silicone resin or the like for attaching the pellicle frame to the photomask, and over this agglutinant layer is laid a releasable liner (separator) for protecting the agglutinant layer.

The application of the agglutinant onto the pellicle frame is conducted by brush painting, spraying, dipping, extrusion form a tube or a cartridge, automatic dispensing, or the like (ref. IP Publication 4); however, in any of these procedures, it has been inevitable that a bubble or foam occurs in the agglutinant layer which is thought to originate from the agglutinant itself or from the air trapped between the agglutinant and the pellicle frame as the former is applied to the latter.

Such foam would naturally go out as the agglutinant layer was let to sit for a period; but when the agglutinant is of such a type that it is to be diluted in a solvent, the foam would not go out easily, because as the solvent quickly evaporates, the viscosity of the agglutinant layer increases, making it harder for the foam to penetrate and go out; so that it was necessary to remove the foam as early as possible. For if the foam stays in the agglutinant layer, during a pellicle inspection, it glitters reflecting a focused light beam and is mistaken as foreign particles whereby not only the appearance but also the quality of the agglutinant layer is underestimated and thus the pellicle frame is eliminated off the production line and causes a reduction in the yield of the pellicles manufactured.

A conventional method for removing foam from a liquid has been to use an antifoaming agent. Examples of effective antifoaming agent for non-aqueous foamed liquid include silicone oil-based agents such as KF-96, KS-66, KS-602A, FA-600, FA-630, FL-100, FL-50 (which are commercial products of Shin-Etsu Chemical Co., Ltd.); among these agents fluorine-modified silicone oils such as FA-600, FA-630, FL-100 and FL-50 (which are commercial products of Shin-Etsu Chemical Co., Ltd.) are particularly effective.

PRIOR ART PUBLICATIONS

IP Publications

[IP Publication 1]
Japanese Patent Application Publication S58-219023 (1983)
[IP Publication 2]
U.S. Pat. No. 4,861,402
[IP Publication 3]
Japanese Publication for Public Review of Allowable Patent Application S63-27707 (1988)
[IP Publication 4]
Japanese Patent Application Publication 1107-24390 (1995)

SUMMARY OF THE INVENTION

Problems the Invention Seeks to Solve

In order for a fluorine-modified silicone oil to perform as an effective antifoaming agent, it has to have a relatively low compatibility with a targeted non-aqueous foamed liquid; wherefore, if a non-aqueous foamed liquid containing a fluorine-modified silicone oil as the antifoaming agent is let to sit for a long period of time, the fluorine-modified silicone oil would bleed out on the surface of the liquid on account of the low compatibility. Thus, if a fluorine-modified silicone oil is added as it is to an agglutinant, the fluorine-modified silicone oil added to the agglutinant would bleed out and cover the surface of the agglutinant layer, whereby the agglutination strength of the agglutinant layer is lowered with a result that the adhesion of the pellicle to the photomask becomes imperfect. In a worst situation, the pellicle may entirely peel off the photomask during the lithographic operation in a light exposure machine, whereby the light exposure machine may be damaged.

In view of the above-stated circumstances, it is an object of the present invention to provide an agglutinant for pellicle containing an antifoaming agent based on fluorine-modified silicone oil which has a high antifoaming performance and is hard to bleed out on the surface of the agglutinant layer.

Means to Solve the Problem

In order to attain the above object, the present inventors searched hard and through many experiments they found that it is possible to solve the problem by adding a small amount of reactive fluorine-modified silicone oil to the agglutinant, which is for adhering the pellicle to the photomask, and hence they completed the present invention.

The detailed sequence of conceptions that led to the present invention is as follows: the silicone-based agglutinant that is used to make the agglutinant layer for the pellicle undergoes curing as an addition reaction takes place between SiH and SiCH=$CH_2$, which are contained in the agglutinant composition, and the present inventors focused their attention on the fact that the SiH/(SiCH=$CH_2$) molar ratio is usually from 5 through 20, that is, the amount of SiH is excessive. Accordingly, the inventors came to have an idea that by using as the antifoaming agent a reactive fluorine-modified silicone oil in which a reactive functional group, such as vinyl group, is introduced, it is possible to immobilize the reactive fluorine-modified silicone oil in the agglutinant agent as a consequence of a reaction between the excessive SiH and the reactive functional group, e.g., vinyl group, of the reactive fluorine-modified silicone oil. And through this mechanism, the inventors found that it is possible to have the reactive fluorine-modified silicone oil perform its duty as the antifoaming agent and thereafter to stop itself from bleeding out on the surface of the agglutinant layer, and hence they possessed the invention.

Therefore, the agglutinant for pellicle according to the present invention is an agglutinant for pellicle which binds the pellicle to the photomask, and is characteristic in that it contains an agglutinant and a reactive fluorine-modified silicone oil.

Also, the pellicle according to the present invention is a pellicle comprising a pellicle frame, a pellicle membrane which is adhered to one of the annular faces of the pellicle frame, and an agglutinant layer laid on another annular face of the pellicle frame for enabling this another annular face of the pellicle frame to adhere to a photomask; and this agglutinant layer is characteristic in that it is made of the above-defined agglutinant for pellicle of the present invention.

The antifoaming agent according to the present invention is an antifoaming agent characteristic in that it contains a reactive fluorine-modified silicone oil as an ingredient that imparts antifoaming effect to the agent.

Effects of the Invention

The agglutinant for pellicle according to the present invention contains the antifoaming agent which comprises the reactive fluorine-modified silicone oil as an element that imparts antifoaming effect to the antifoaming agent so that it is possible to reduce the foaming which occurs during the laying of the agglutinant layer and the curing of it in the course of the pellicle manufacture process, whereby the bleeding out of the reactive fluorine-modified silicone oil on the surface of the agglutinant layer is suppressed, with a result that the detachment of the pellicle frame from the photomask is prevented and also the yield of the pellicle manufacture is improved.

BRIEF DESCRIPTIONS OF DRAWINGS

FIG. 1 A schematic longitudinal cross-sectional view showing an example of the pellicle of the present invention in which the agglutinant layer is made of the agglutinant for pellicle of the present invention to which a reactive fluorine-modified silicone oil is added.

Figure 2:
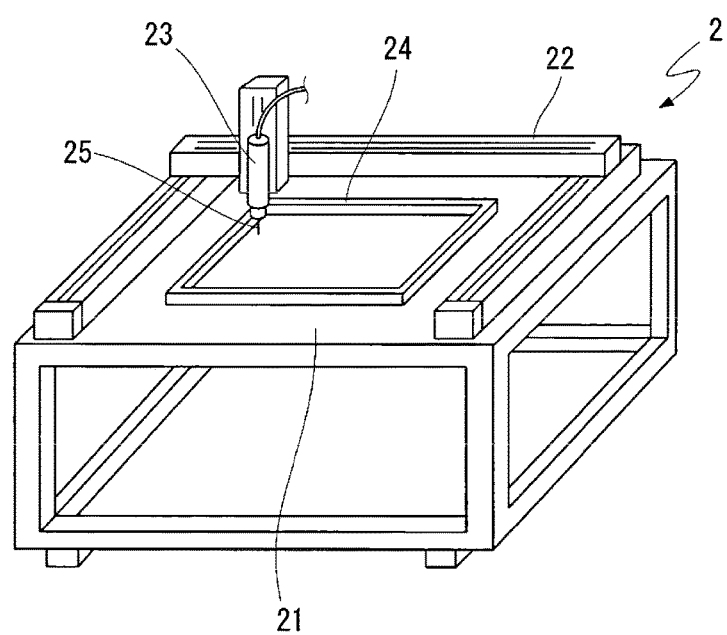

FIG. 2 A schematic view showing an example of the agglutinant dispenser equipment.

EXAMPLES TO EMBODY THE INVENTION

Now, the present invention will be explained in greater detail with reference to the drawings, and one should not be misled to construe the invention to be limited to the examples or the drawing.

FIG. 1 is a schematic longitudinal cross-sectional view showing an example of the pellicle of the present invention, which adopts an agglutinant layer made of the agglutinant for pellicle of the present invention to which a reactive fluorine-modified silicone oil is added.

As shown in FIG. 1, a pellicle 1 embodying an example of the present invention is constructed in a manner such that a pellicle membrane 11 is tensely adhered to an upper annular face of a pellicle frame 12, which has a shape corresponding to the shape of a photomask (glass base plate) to which the pellicle 1 is adhered, the shape of the pellicle frame 12 being generally quadrilateral (either rectangular or square), and such that an agglutinant layer 13 is formed on a lower annular face of the pellicle frame 12 for the purpose of enabling the pellicle 1 to adhere to the photomask (glass base plate). This agglutinant layer 13 is made of the agglutinant for pellicle according to the present invention, that is, it contains an agglutinant and a reactive fluorine-modified silicone oil. Also, a releasing layer (separator) 14 for protection of the agglutinant layer 13 is detachably adhered to the exposed lower face of the agglutinant layer 13. It is noted that, in the present invention, there are no limitations to the materials of which the pellicle membrane or pellicle frame are made, and it is possible to use any materials conventionally known to have been used, but from the viewpoints of rigidity and the machinability, the pellicle frame is preferably made of metal. The pellicle membrane may be adhered to the pellicle frame in any known method.

In the pellicle of the present invention, the agglutinant for pellicle of the present invention is laid on the lower annular face of the pellicle frame in a manner such that the resulting agglutinant layer has a predetermined width (normally equal to or smaller than the width of the frame bar) and such that it enables the entirety of the lower annular face of the pellicle frame to be adhered to the photomask (glass base plate).

As is explained above, the agglutinant for pellicle of the present invention contains a reactive fluorine-modified silicone oil, but the base material of the agglutinant for pellicle can be selected from any known agglutinants. Especially silicone agglutinant consisting mainly of silicone composition, or acrylic agglutinant consisting mainly of acrylic composition, or a natural rubber based agglutinant are preferable. Among these, silicone agglutinant is desirable on account of its weather resistance, heat resistance, low temperature resistance, electric insulation, etc., and examples of it include X-40-3122, KR-3700, X-40-3103, and X-40-3264 (all commercially available products of Shin-Etsu Chemical Co., Ltd.). Among the silicone agglutinants, X-40-3122 (Product of Shin-Etsu Chemical Co., Ltd.) is particularly desirable because of its high adhesive strength and reduced content of low-molecular siloxane. Among the acrylic agglutinants, it is possible to use, for example, acrylic agglutinants (adhesives) of SK Dyne series put on the market by Soken Chemical & Engineering Co., Ltd.; among them SK-1495 (commercial product of Soken Chemical & Engineering Co., Ltd.) is particularly desirable on account of its high adhesive strength and workability.

The reactive fluorine-modified silicone oil which is added to the agglutinant is to be defined as a fluorine-modified silicone oil which has a functional group—which is reactive with a functional group contained in the agglutinant composition—at one or both ends of the polysiloxane chain, at a side chain, or at end(s) of the polysiloxane chain plus at a side chain. In other words the reactive fluorine-modified silicone oil has at least one functional group reactive with a functional group contained in the agglutinant composition. If the agglutinant to which the reactive fluorine-modified silicone oil is added is a silicone agglutinant or an acrylic agglutinant, it is preferable to use a reactive fluorine-modified silicone oil represented by the general formula (1) shown below:

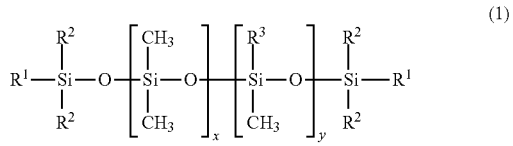

(1)

wherein, $R^1$ is a vinyl group or an isocyanate group; $R^2$ is independently a hydrogen atom, a halogen atom, a hydroxyl group, a vinyl group, a 1-12C alkyl group or a 1-12C alkoxy group; $R^3$ is a 3-14C fluorine atom-containing alkyl group; the subscript x is a whole number of 0 or greater and the subscript y is a whole number of 1 or greater such that $20 \le x+y \le 1000$ and $0.1 \le y/(x+y) \le 1.0$; and the blocks subscripted by x or y can be arrayed at random.

In the general formula (1), if $R^2$ is an alkyl group, it shall have 1-12 carbon atoms and preferably 1-8 carbon atoms; for example, it can be methyl group, ethyl group, propyl group, butyl group or the like, and among them methyl group and ethyl group are better, and methyl group is the best.

In the case in which $R^2$ is an alkoxy group it shall have 1-12 carbon atoms and preferably 1-8 carbon atoms, or more preferably 1-4 carbon atoms; for example, it can be methoxy group, ethoxy group, propoxy group, butoxy group or the like, and methoxy group and ethoxy group are preferable.

The fluorine atom-containing alkyl group represented by $R^3$ has 3-14 carbon atoms and preferably 3-10 carbon atoms, or more preferably 3-8 carbon atoms. In particular, $R^3$ is preferably the kind represented by the general formula (2) shown below:

(2)

wherein the subscript a is a whole number of 1 or greater, preferably 2 or 3, and most preferably 2; the subscript b is a whole number of 1 or greater, preferably 1-8; at the same time a+b must be 3-14, preferably 3-10 and most preferably 3-8.

Examples of $R^3$ include $-CH_2CH_2CF_3$, $-CH_2CH_2C_4F_9$, and $-CH_2CH_2C_8F_{17}$; among these $-CH_2CH_2CF_3$ and $-CH_2CH_2C_4F_9$ are particularly preferable.

In the case where a silicone agglutinant is used to make the agglutinant layer, a preferable reactive fluorine-modified silicone oil is one in which the $R^1$ of the general formula (1) representing reactive fluorine-modified silicone oil is vinyl group, which is capable of reacting with SiH group, which is a reactive functional group in the silicone agglutinant composition.

On the other hand, in the case where an acrylic agglutinant is used to make the agglutinant layer, a preferable reactive fluorine-modified silicone oil is one in which the $R^1$ of the general formula (1) representing reactive fluorine-modified silicone oil is isocyanate group ($-N=C=O$), which is capable of reacting with hydroxyl group, amino group, and carboxyl group, which are some of reactive functional groups in the acrylic agglutinant composition.

The dosage of the reactive fluorine-modified silicone oil against 100 mass parts of the agglutinant is 0.0001 through 1 mass part, preferably 0.0001 through 0.5 mass part, and more preferably 0.0001 through 0.1 mass part. If the dosage of the reactive fluorine-modified silicone oil is less than 0.0001 mass part, it becomes difficult to obtain a sufficient foam elimination (de-foaming) result; on the other hand, if the dosage is greater than 1 mass part, the effectiveness of the properties of the agglutinant of the present invention such as weather resistance and heat resistance may be impaired.

Also, it is acceptable to add different additives to the agglutinant for pellicle of the present invention, for different purposes, if need be, to the extents that would not thwart the effects of the present invention. Examples of such additives include pigment, dye, plasticizer, flame retardant, heat resistance improver, weather resistance improver, thixotropy imparting agent, antibacterial agent, and anti-mold agent.

If it is difficult to dispense the agglutinant containing the reactive fluorine-modified silicone oil because of high viscosity thereof, it is possible, depending on the degree of necessity, to dilute the agglutinant with a solvent, for example an aromatic solvent such as toluene and xylene, or an aliphatic solvent such as hexane, octane, isooctane, and isoparaffin, or a ketones solvent such as methyl ethyl ketone and methyl isobutyl ketone, or an ester solvent such as ethyl acetate and butyl acetate, or an ethers solvent such as diisopropyl ether and 1,4-dioxane, or a mixture of any of these.

On the other hand, as described earlier, the antifoaming agent of the present invention is one which contains the above-mentioned reactive fluorine-modified silicone oil as an ingredient that imparts antifoaming effect to the agent. It is possible that the antifoaming agent of the present invention consists only of the reactive fluorine-modified silicone oil; but it can be diluted with a solvent such as the ones named immediately above, if appropriate. Also it is possible to add one or more other ingredients to the antifoaming agent to an extent that the addition does not impair the antifoaming effect.

As described above, a pellicle of the present invention includes a pellicle frame having two annular faces, a pellicle membrane which is adhered to one of the annular faces of the pellicle frame, and an agglutinant layer laid on the other annular face of the pellicle frame for enabling the pellicle frame to adhere to the photomask; and this agglutinant layer is made of a special agglutinant for pellicle as defined in the present invention. The application of the agglutinant for pellicle to the pellicle frame may be conducted by using, for example, an agglutinant dispenser machine. FIG. 2 is a schematic view showing an example of the agglutinant dispenser machine 2, which can be suitably used to form the agglutinant layer in the course of manufacturing a pellicle according to the present invention. In this agglutinant dispenser machine 2, a syringe 23 is held above a pedestal frame 21 via a three-axis robot 22, which is constituted by a combination of a stationary rail and a movable rail, in a manner such that the syringe 23 is enabled to move in directions of x, y and z axes. This syringe 23 has a needle 25 at its forefront; and the syringe 23 filled with the agglutinant for pellicle of the present invention is connected to an air pressure type dispense means (not shown) and both the robot operation and the liquid discharge operation of the syringe 23 are controlled by a control means (not shown) of the three-axis robot 22. Then, the pellicle frame 24 is set on the pedestal frame 21 of the agglutinant dispenser machine 2 (with the lower annular face of the pellicle frame facing upward) and the agglutinant for pellicle of the present invention is dropped from the needle 25 while the syringe is shifted, whereby the agglutinant is applied to the pellicle frame 24.

As for a transport means (not shown) for the agglutinant, it is possible to select from various types which have a function of controlling the supply rate and the timings of discharge and non-discharge, such as a syringe pump, a plunger pump, a tube pump as well as a pneumatic type system using air pressure, nitrogen gas pressure or the like The releasing layer (separator) 14 is for the protection of the agglutinant layer 13 until the pellicle is adhered to the photomask, and hence it is removed before the pellicle is put in use. For this reason, the releasing layer (separator) is used only in such cases where the agglutinant layer is not protected otherwise and thus in need of being protected during the time until the pellicle is adhered to the photomask. The product pellicle is distributed in the market generally in the form in which the releasing layer (separator) is attached to the agglutinant layer. Choice of the material for the releasing layer (separator) is not limited, and can be made from anything conventionally known to have been used. Also, the releasing layer (separator) can be adhered to the agglutinant layer by any known tape adhesion method.

EXAMPLES

Herein-below, the present invention will be explained in detail with reference to examples and comparative examples; however the scope of the present invention is not limited by the examples.

Example 1

Firstly, a rectangular pellicle frame made of an aluminum alloy measuring externally 782 mm (long side) by 474 mm (short side), internally 768 mm (long side) by 456 mm (short side) and 5.0 mm (height) was obtained by machining; the inner and outer side edges of both the upper and lower annular faces 2 (where the annular faces meet with the inner or outer side walls of the pellicle frame) were also rounded by machining so that the flat portion of the annular faces had a width of 4.0 mm; the inner corners of the pellicle frame were also machined to R:2.0 mm and the outer corners were machined to R:6.0 mm; then the surfaces were subjected to a black colored alumite treatment. This pellicle frame was then brought in a cleanroom, and after being thoroughly washed with a neutral detergent and pure water, it was dried.

Next, the pellicle frame 24 was fixed on the pedestal frame 21 of the agglutinant dispenser machine 2, shown in FIG. 2, in a manner such that the lower annular face of the pellicle frame 24 (the face due to receive the agglutinant) faces upward.

Meanwhile, an agglutinant for pellicle, which is to be applied to the lower annular face of the pellicle frame 24, was prepared by mixing 100 mass parts of silicone agglutinant X-40-3122 (a commercial product of Shin-Etsu Chemical Co., Ltd.) with 0.01 mass part of a reactive fluorine-modified silicone oil, which had a viscosity of 5000 mPa·s and is represented by the following general formula (1) in the case where $R^1$ is vinyl group, $R^2$ is methyl group, $R^3$ is —$CH_2CH_2CF_3$ and x+y=250 and y/(x+y)=0.7.

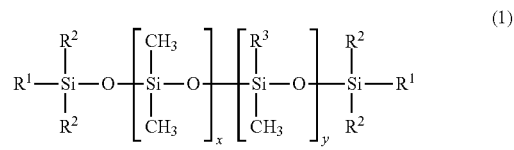

Then, with the thus prepared agglutinant for pellicle the syringe 23 made of polypropylene (PP) of the agglutinant dispenser machine 2, shown in FIG. 2, was filled. The syringe 23 was connected to an air pressure type dispense means (manufactured by Iwashita Engineering Co., Ltd.; not shown), and both the robot operation and the liquid discharge operation of the syringe 23 were controlled automatically by a control means (not shown) of the three-axis robot 22; thus, the agglutinant for pellicle was dropped from the needle 25 onto the lower annular face of the pellicle frame 24 (now facing upward during this agglutinant application) in a manner such that the entire flat area of the lower agglutinant face all around the pellicle frame 24 was applied with the agglutinant for pellicle.

Next, the agglutinant for pellicle was dried by air until it lost fluidity and then the pellicle frame was heated to 130 degrees C. by a high frequency induction heater (not shown) whereby the solvent was completely evaporated and the agglutinant was cured and formed an agglutinant layer.

A pellicle membrane was adhered to the upper annular face of the pellicle frame by means of an adhesive named CYTOP CTX-A (a commercial product of ASAHI GLASS CO., LTD.), and excessive part of the pellicle membrane extending beyond the pellicle frame was trimmed off with a knife cutter, whereby a pellicle was completed.

Example 2

A pellicle was made in the same manner as in Example 1 except that the agglutinant for pellicle was prepared by adding to 100 mass parts of the silicone agglutinant X-40-3122 (a commercial product of Shin-Etsu Chemical Co., Ltd.) 0.0001 mass part of a reactive fluorine-modified silicone oil (viscosity: 5000 mPa·s) represented by the above described general formula (1) in the case where $R^1$ is vinyl group, $R^2$ is methyl group, $R^3$ is —$CH_2CH_2CF_3$ and x+y=250 and y/(x+y)=0.7.

Example 3

A pellicle was made in the same manner as in Example 1 except that the agglutinant for pellicle was prepared by adding to 100 mass parts of the silicone agglutinant X-40-3122 (a commercial product of Shin-Etsu Chemical Co., Ltd.) 0.1 mass part of a reactive fluorine-modified silicone oil (viscosity: 5000 mPa·s) represented by the above described general formula (1) in the case where $R^1$ is vinyl group, $R^2$ is methyl group, $R^3$ is —$CH_2CH_2CF_3$ and x+y=250 and y/(x+y)=0.7.

Example 4

A pellicle was made in the same manner as in Example 1 except that the agglutinant for pellicle was prepared by adding to 100 mass parts of the silicone agglutinant X-40-3122 (a commercial product of Shin-Etsu Chemical Co., Ltd.) 0.01 mass part of a reactive fluorine-modified silicone oil (viscosity: 200 mPa·s) represented by the above described general formula (1) in the case where $R^1$ is vinyl group, $R^2$ is methyl group, $R^3$ is —$CH_2CH_2CF_3$ and x+y=100 and y/(x+y)=0.5.

Example 5

A pellicle was made in the same manner as in Example 1 except that the agglutinant for pellicle was prepared by adding to 100 mass parts of the silicone agglutinant X-40-3122 (a commercial product of Shin-Etsu Chemical Co., Ltd.) 0.01 mass part of a reactive fluorine-modified silicone oil (viscosity: 30000 mPa·s) represented by the above described general formula (1) in the case where $R^1$ and $R^2$ are all vinyl group (hence constituting a tri-vinyl group at both ends of the chain), $R^3$ is —$CH_2CH_2CF_3$ and x+y=500 and y/(x+y)=0.7.

Example 6

A pellicle was made in the same manner as in Example 1 except that the agglutinant for pellicle was prepared by adding to 100 mass parts of the acrylic agglutinant SK-1495 (a commercial product of Soken Chemical & Engineering Co., Ltd.) 0.01 mass part of a reactive fluorine-modified silicone oil (viscosity: 5000 mPa·s) represented by the above described general formula (1) in the case where $R^1$ is isocyanate group, $R^2$ is methyl group, $R^3$ is —$CH_2CH_2CF_3$ and x+y=250 and y/(x+y)=0.7.

Comparative Example 1

A pellicle was made in the same manner as in Example 1 except that the silicone agglutinant X-40-3122 (a commercial product of Shin-Etsu Chemical Co., Ltd.) was again used but no reactive fluorine-modified silicone oil was added to it.

Comparative Example 2

A pellicle was made in the same manner as in Example 1 except that the agglutinant for pellicle was prepared by adding to 100 mass parts of the silicone agglutinant X-40-3122 (a commercial product of Shin-Etsu Chemical Co., Ltd.) 0.01 mass part of a non-reactive fluorine-modified silicone oil (viscosity; 5000 mPa·s) represented by the above described general formula (1) in the case where $R^1$ and $R^2$ are methyl group, $R^3$ is —$CH_2CH_2CF_3$ and x+y=500 and y/(x+y)=0.5.

The pellicles made in Examples 1-6 and Comparative Examples 1 and 2 were estimated with respect to the appearance of the agglutinant layer (rate of foam occurrence) and bleeding on the agglutinant layer surface in terms of the following parameters.

[Appearance of the Agglutinant Layer (Rate of Foam Occurrence)]

Whether or not foam had occurred in the agglutinant layer for pellicle was inspected. The inspection was conducted visually after the curing of the agglutinant layer for pellicle; the rate of foam occurrence was calculated in accordance with the following equation. In each of the examples and the comparative examples, twenty pellicles were made for the test; thus the number of the pellicles to which the agglutinant for pellicle was applied were 20 (hence N=20 in the following equation is 20). The results are shown in Table 1.

[rate of foam occurrence (%)]=n/N×100 where n is the number of the pellicles whose agglutinant layer had foam occurrence, and N is the number of the pellicles tested.

[Bleeding on the Surface of the Agglutinant Layer]

The pellicle was let to sit for one week in a thermostat chamber regulated at 50 degrees C.; thereafter the surface of the agglutinant layer of the pellicle was visually inspected for whether or not the fluorine-modified silicone oil had bled out on the surface of the agglutinant layer. The results are shown in Table 1.

TABLE 1

| | Examples | | | | | | Comparative Examples | |
|---|---|---|---|---|---|---|---|---|
| | 1 | 2 | 3 | 4 | 5 | 6 | 1 | 2 |
| appearance of agglutinant layer (rate of foam occurrence) | 0% | 0% | 0% | 0% | 0% | 0% | 20% | 0% |
| Bleed out on surface of agglutinant layer | none | none | none | none | none | none | none | some |

As is known from the results in Table 1, if an agglutinant for pellicle of the present invention, which contains an agglutinant and a reactive fluorine-modified silicone oil, is used, it is possible to minimize the foam that occurs at the time of the application of the agglutinant for pellicle as well as at the time the agglutinant layer is cured thereafter; at the same time it becomes also possible to suppress the bleeding out of the reactive fluorine-modified silicone oil on the surface of the agglutinant layer, so that the yield of the product pellicle manufacture is improved.

REPRESENTATION OF REFERENCE NUMERALS

1: pellicle
11: pellicle membrane
12: pellicle frame
13: agglutinant layer (agglutinant for pellicle containing reactive fluorine-modified silicone oil)
14: releasing layer (separator)
2: agglutinant dispenser machine
21: pedestal frame
22: three-axis robot
23: syringe
24: pellicle frame
25: needle Scopes of what is claimed:
1. An agglutinant layer for pellicle for binding the pellicle to a photomask, wherein said agglutinant layer for pellicle is obtained by curing a composition which contains a silicone agglutinant having SiH groups and a reactive fluorine-modified silicone oil having vinyl groups at both ends of its molecular chain, wherein the molar ratio of the SiH groups in the silicone agglutinant is in excess to the vinyl groups in the silicone oil.

2. The agglutinant layer for pellicle as claimed in claim 1 wherein said reactive fluorine-modified silicone oil is a fluorine-modified silicone oil represented by the general formula (1):

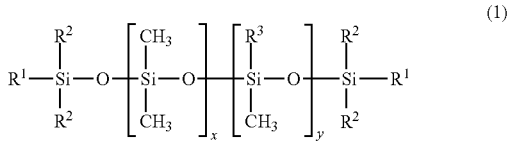

wherein, $R^1$ is a vinyl group or an isocyanate group; $R^2$ is independently a hydrogen atom, a halogen atom, a hydroxyl group, a vinyl group or a 1-12C alkyl group or a 1-12C alkoxy group; $R^3$ is a 3-14C fluorine atom-containing alkyl group; the subscript x is a whole number of 0 or greater and the subscript y is a whole number of 1 or greater such that $20 \leq x+y \leq 1000$ and $0.1 \leq y/(x+y) \leq 1.0$; and the blocks subscripted by x or y are optionally arrayed at random.

3. The agglutinant layer for pellicle as claimed in claim 1 wherein a dosage of said reactive fluorine-modified silicone oil against 100 mass parts of said agglutinant is 0.0001 through 1 mass part.

4. The agglutinant layer as claimed in claim 1, wherein the molar ratio of the SiH groups in the silicone agglutinant to the vinyl groups in the silicone oil, the $SiH/(SiCH=CH_2)$ molar ratio, is from 5 through 20.

5. A pellicle comprising a pellicle frame having two annular faces, a pellicle membrane which is tensely adhered to one of said annular faces of the pellicle frame, and an agglutinant layer laid on another annular face of said pellicle frame for enabling said pellicle to adhere to a photomask, wherein said agglutinant layer is obtained by curing a composition which contains a silicone agglutinant having SiH groups and a reactive fluorine-modified silicone oil having vinyl groups at both ends of its molecular chain, wherein the molar ratio of the SiH groups in the silicone agglutinant is in excess to the vinyl groups in the silicone oil.

6. The pellicle as claimed in claim 5 wherein said reactive fluorine-modified silicone oil is a fluorine-modified silicone oil represented by the formula (1):

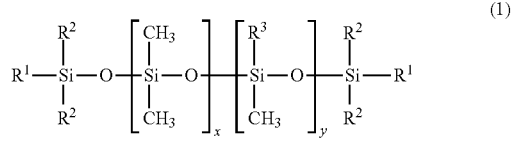

wherein, $R^1$ is a vinyl group or an isocyanate group; $R^2$ is independently a hydrogen atom, a halogen atom, a hydroxyl group, a vinyl group or a 1-12C alkyl group or a 1-12C alkoxy group; $R^3$ is a 3-14C fluorine atom-containing alkyl group; the subscript x is a whole number of 0 or greater and the subscript y is a whole number of 1 or greater such that $20 \leq x+y \leq 1000$ and $0.1 \leq y/(x+y) \leq 1.0$; and the blocks subscripted by x or y are optionally be arrayed at random.

7. The pellicle as claimed in claim 5 wherein a dosage of said reactive fluorine-modified silicone oil against 100 mass parts of said agglutinant is 0.0001 through 1 mass part.

8. The pellicle as claimed in claim 5, wherein the molar ratio of the SiH groups in the silicone agglutinant to the vinyl groups in the silicone oil, the $SiH/(SiCH=CH_2)$ molar ratio, is from 5 through 20.

\* \* \* \* \*